United States Patent [19]

Aklufi

[11] Patent Number: 4,707,217

[45] Date of Patent: Nov. 17, 1987

[54] SINGLE CRYSTAL THIN FILMS

[75] Inventor: Monti E. Aklufi, San Diego, Calif.

[73] Assignee: The United States of America as represented by the Secretary of the Navy, Washington, D.C.

[21] Appl. No.: 868,399

[22] Filed: May 28, 1986

[51] Int. Cl.⁴ ............................................. C30B 13/12
[52] U.S. Cl. ................................ 156/617 R; 156/620; 156/DIG. 73; 156/DIG. 80; 156/DIG. 88; 156/DIG. 102
[58] Field of Search .................... 156/617 R, DIG. 80, 156/DIG. 102, DIG. 11, 616 R, 620, DIG. 73, DIG. 88

[56] References Cited

U.S. PATENT DOCUMENTS

| | | | |
|---|---|---|---|
| 3,977,934 | 8/1976 | Lesk | 156/617 R |
| 4,046,618 | 9/1977 | Chandhuri et al. | 156/617 R |
| 4,196,041 | 4/1980 | Baghdadi et al. | 156/617 R |
| 4,345,967 | 8/1982 | Cook | 156/DIG. 88 |
| 4,659,422 | 4/1987 | Sakurai | 156/DIG. 102 |

OTHER PUBLICATIONS

Aklufi, "The Crystallization of Thin Silicon Films with Laser Shaped Hot Zones", PhD Thesis, (6/1985).

Primary Examiner—Asok Pal
Attorney, Agent, or Firm—Robert F. Beers; Ervin F. Johnston; Harvey Fendelman

[57] ABSTRACT

A system and techniques are disclosed for forming single crystal films with the use of energy sources that can create shaped hot zones. The energy may be from any source provided that it can be shaped, directed and can heat the film to become molten and recrystallized by liquid phase epitaxy. The hot zone created by the heat source is shaped such that the angle defined by the scanned hot zone's trailing liquid edge is smaller than the angle defined by the intersection of the crystal's slowest growth planes.

14 Claims, 16 Drawing Figures

SINGLE CRYSTAL THIN FILMS

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

The usefulness of thin single crystal silicon films on electrically insulating substrates for electronic devices, such as integrated circuits, becomes apparent when one considers that these circuits are contained within the top micrometer of the silicon material. In addition to improving the electrical circuit characteristics, the material is used more effectively. From the device standpoint higher circuit densities as well as improved device performance are obtainable in the area of high speed signal processing, lower power consumption, and higher tolerance in radiation environments.

Heating is the principle parameter used in controlling the crystallization of bulk and thin film semiconductor silicon. However, a thin film need only be locally heated, as dictated by its thickness and as such differs in its requirements of heat application from that of the bulk material. For heating purposes, lasers are unique in that their beams can be projected over long distances, are collimated, and can be controlled spatially as well as temporally. Laser beams can irradiate the top layer of a material leaving other regions essentially unheated. With all these features laser beams have the potential of being the principal heat source used in the crystallization of thin silicon films.

Crystal growing from a single component melt and its subsequent uncontrolled freezing, results in a polycrystalline structure. It has been shown that for seeded crystal growth, freezing liquid-solid interfaces that are concave towards the liquid favor single crystal growth. An important aspect in solid state devices is the crystalline quality of the semiconductor material as it effects the device's electrical characteristics. Until the present invention, however, the mechanism that can be used to ensure single crystal growth upon freezing of a melted semiconductor such as silicon has not been recognized or understood. For a more thorough and detailed discussion and examination of prior art techniques and developments in this area, reference is made to Appendix 1 to this patent application entitled "THE CRYSTALLIZATION OF THIN SILICON FILMS WITH LASER SHAPED HOT ZONES", June 1985, authored by the present inventor and hereby incorporated by reference in its entirety.

SUMMARY OF THE INVENTION

It has been discovered in accordance with the present invention that single crystal growth on amorphous or polycrystalline substrates is thermodynamically favored under specific conditions. In accordance with the present invention single crystal growth can be obtained by maintaining $\theta$, the angle defined by the scanned hot zone's trailing liquid edge smaller than $\alpha$, the included angle defined by the intersection of the crystal's preferred growth planes. Further, in accordance with the present invention it has been discovered that single crystal film growth is favored when the thermal gradient and crystal facet lengths are maximum and the angle defined by the scanning laser hot zone's trailing liquid edge, $\theta$, is at a minimum.

Thus, the present invention involves the steps of establishing a layer of a semiconductor material such as silicon or any other material that has a crystalline state and then scanning surface of the material with a wedge-shaped heat zone created by the heat source such that the angle $\theta$ of the wedge-shaped heat source is less than the angle $\alpha$ which is defined by the intersection of the preferred growth planes of the material. The hot zone is scanned across the surface of the material with the apex of the wedge-shaped hot zone at the leading edge of the scan direction so as to melt within the hot zone at least a portion of the surface of the material. As the heat source scan is continued, the melted portion of the material at the trailing edge of the hot zone is caused to solidify into single crystal material.

It is to be understood that it is within the scope of the present invention to use the technique and process steps of the present invention to create single crystal material from any material that has a crystalline state, whether the process uses seeded crystal growth or does not use seeded crystal growth. The process of the present invention may be used on semiconductor material that is comprised of a thin layer over an amorphous insulator material. Further, the present invention may be implemented with any suitable heat source such as lasers, solar concentrators, high intensity light sources, electron beams and induction and resistance heaters.

OBJECTS OF THE INVENTION

It is the primary object of the present invention to disclose a novel technique and apparatus for obtaining the growth of single crystal material.

It is a further object of the present invention to disclose a method and apparatus for obtaining single crystal semiconductor film growth and thereby enabling the manufacture of radiation hardened integrated circuits and enabling higher circuit densities and improved device performance over integrated circuits formed on bulk single crystal semiconductor substrates.

It is a further object of the present invention to disclose a method and apparatus for enabling the manufacture of single crystal films on amorphous insulating semiconductor substrates.

These and other objects of the invention will become apparent when considered in conjunction with the accompanying drawings and specification.

DESCRIPTION OF THE PREFERRED EMBODIMENT

Figure 1A:
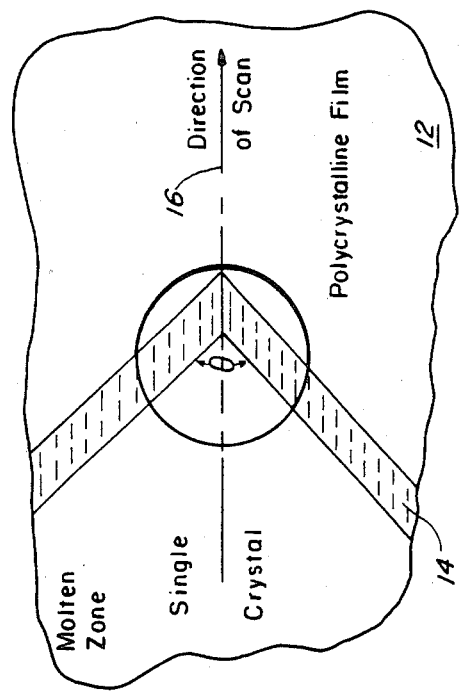
FIG. 1A is a schematic illustration of a wedge-shaped hot zone resulting from use of a shaped heat source and illustrating the relationship between the hot zone angle $\theta$, and the angle $\alpha$, the included angle defined by the intersection of the crystal preferred growth planes.

FIG. 1A depicts a top view illustration of the surface of a film which is not single crystal, e.g. a film of polycrystalline material 12. The polycrystalline film 12 may be a silicon film, a germanium film or any other semiconductor material. A heat source, not shown, but to be described in further detail later in this specification, is used in accordance with the present invention to create a wedge-shaped molten zone 14. The scan direction of the molten zone is indicated by the direction of the arrow 16 in FIG. 1A. The angle $\theta$ is the angle defined by the included angle of the molten zone created by the heat source 14 and results in a molten zone in the polycrystalline film in the vicinity of the heat source 14. Referring to the enlarged view of FIG. 1B, it can be seen that the angle $\theta$ defined by the heat source is smaller than the angle $\alpha$, the angle defined by the intersection of the crystal's preferred growth planes. Under this condition the molten film 12 solidifies into single crystal material at the trailing edge of the molten zone. In accordance with the present invention it has been discovered that the single crystal film growth is further favored when the thermal gradient and crystal facet lengths are maximum and when the angle defined by the scanning heat source hot zone's trailing liquid edge $\theta$ is at a minimum. The angle defined by the intersection of silicon's preferred growth planes, the (111) planes, is 70.53°. The (111) planes are the preferred growth planes because they are the most densely packed planes. See, for example, *Silicon Semiconductor Technology*, by W. R. Runyan, Copyright 1965, Chapter 5, for a further discussion of crystal growth of bulk silicon which is also applicable to thin silicon films.

Figure 2A:
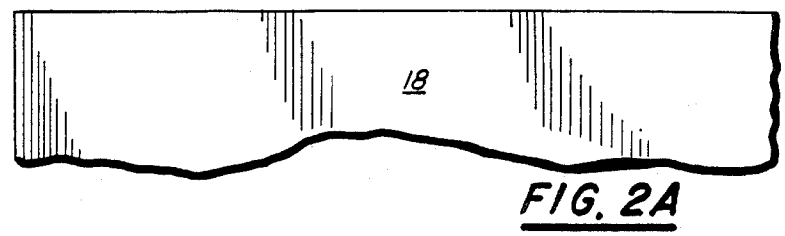
FIGS. 2A, 2B, 2C, 2D, 2E and 2F are sequential process steps illustrating the formation of single crystal film over an amorphous substrate in accordance with the present invention.

Referring now to FIGS. 2A through 2F, the process of using a heat source for creating a molten zone having an included angle $\theta$ that is less than the angle defined by the intersection of the crystal slowest growth planes will be described in terms of the successive steps utilized toward the formation of a single crystal film according to one embodiment of the present invention. In FIG. 2A, the substrate 18 is amorphous silicon dioxide. It is to be understood, however, that other substrates can be employed within the scope of the present invention and that silicon dioxide is used here by way of example only. Any material could be used as a substrate provided that it does not interfere with the crystallization of the film, that it is sufficiently rigid to maintain a planar film structure, that it is able to withstand the temperature excursion that would be experienced by the film during its crystallization and that its surface is sufficiently smooth so as not to interfere with the formation of the single crystal thin film. Other materials that can be used for the substrate could comprise, for example, electrical insulators such as silicon nitride, sapphire, spinel, porcelain, or electrical conductors such as refractory metals, tungsten and molybdenum could also be used. The choice would depend upon whether an insulating or conducting substrate in contact with the single crystal thin film to be formed is required. Also, combinations of insulators and conductors in the form of laminates, with defined conductor patterns on insulating surfaces, can also be used.

Figure 2B:
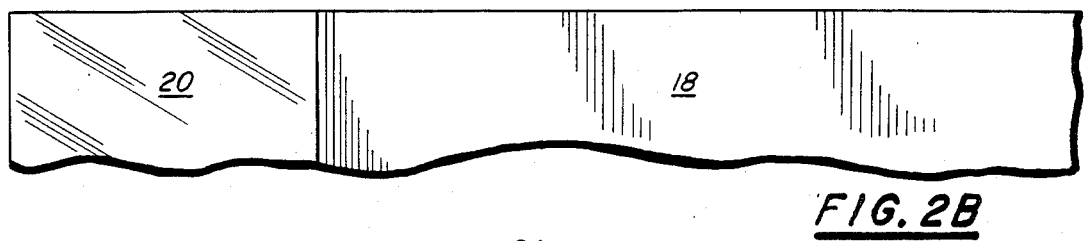

In FIG. 2B, a single crystal seed 20 is placed in juxtaposition next to the substrate 18. The transition region should be as smooth and continuous, as possible, consistent with the thickness of the thin film to be deposited. The choice of seed material determines whether homo or heteroepitaxy is to be performed. For a thin film of silicon, using a single crystal silicon seed would produce a homoepitaxial growth. Single crystal sapphire would lead to heteroepitaxial growth. The seed's crystal orientation in conjunction with the sweep direction will determine the single crystal's thin film orientation. By way of example, a high resistivity single n-type silicon single crystal seed 20 has been chosen and illustrated.

Figure 2C:
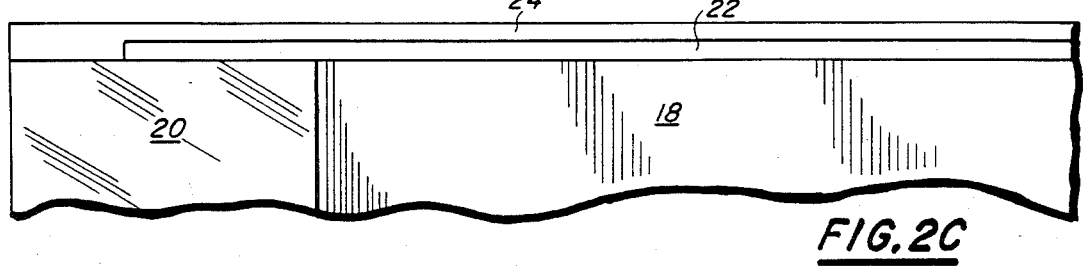

In FIG. 2C, a thin silicon film 22 to be crystallized, and a capping layer 24 that does not chemically react with the transparent silicon film 22 such as silicon dioxide and that serves as an entrainment and an anti-reflectant layer, is placed on top of the substrate 18 and the seed 20. All or part of either the substrate 18 and the seed 20 can be covered with the silicon film 22. To accomplish this step, silicon may be evaporated and appropriate masking can be used to define the area deposited as is well known. Other known techniques such as chemical vapor deposition may be employed. In the embodiment illustrated, the silicon film 22 is deposited undoped. The capping layer 24 may be similarly deposited. If so deposited, its capping ability may be increased by densifying at low temperature, for example, at 875° C. and in a steam ambient.

Figure 1B:
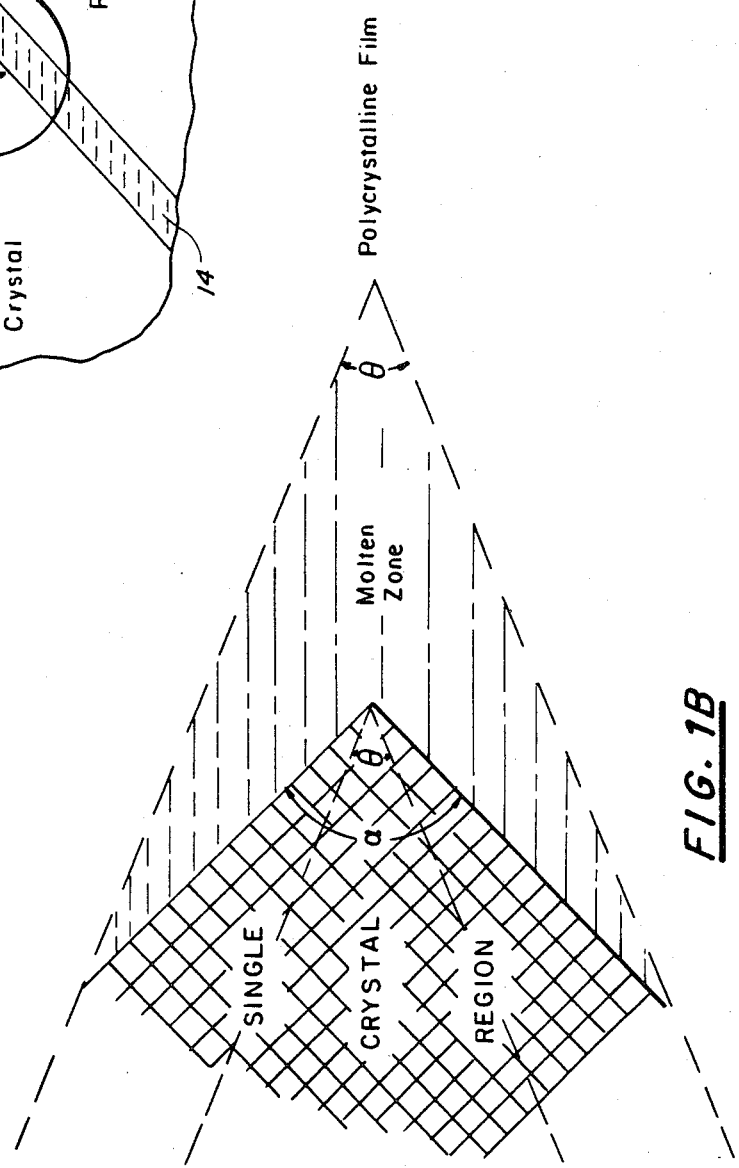
FIG. 1B is an enlarged view of the encircled portion of FIG. 1A.
Figure 2D:
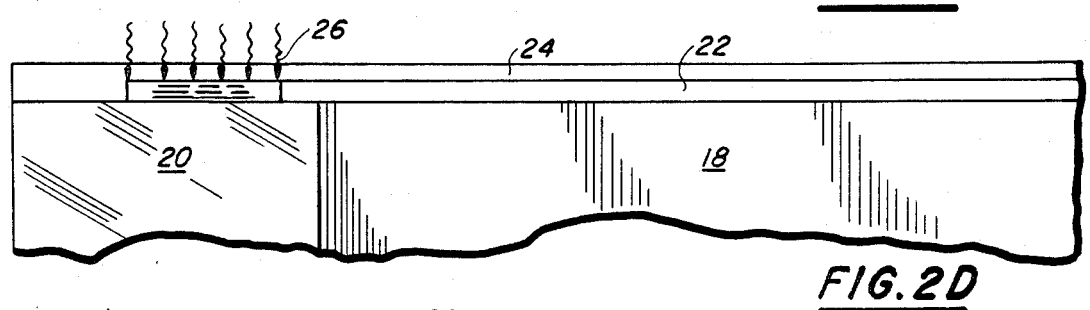
Figure 2E:
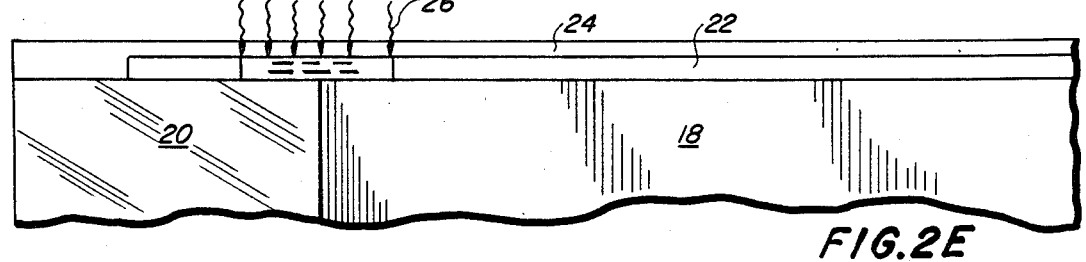
Figure 2F:
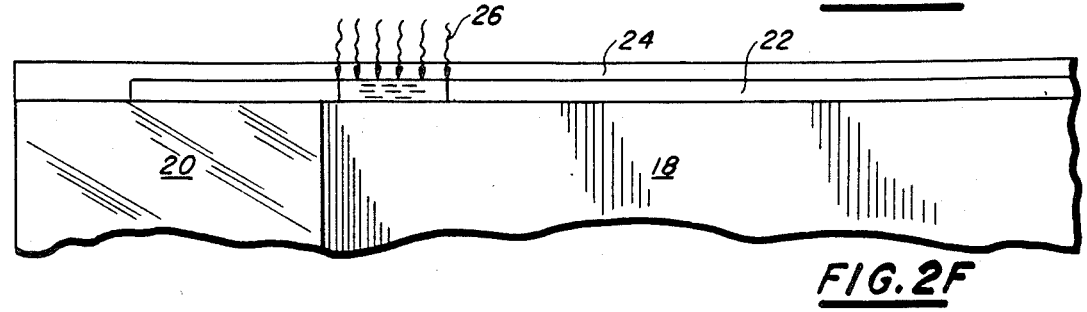

As is illustrated schematically in FIG. 2D, a controlled energy source meeting the conditions shown and described in FIGS. 1A and 1B is used to heat the film 22. The controlled energy beam is depicted in FIGS. 2D through 2F as controlled energy beam 26. The formation of the liquid state is initiated in a region above the single crystal seed 20 as shown in FIG. 2D. The energy source is then swept to the right at a rate of 0.5 cm/sec or more for high density energy sources such as lasers, and at a rate of 0.5 cm/sec or less for low density energy sources such as high energy light source e-beams and resistive heaters. As the molten region above the seed region solidifies, it crystallizes into a single crystal film 25 by vertical homoepitaxy. Sweeping the energy source still further to the right over the substrate 18 continues the melting and crystallization of the film 22 into single crystal structure by horizontally homoepitaxy as is illustrated in FIG. 2F.

Figure 3:
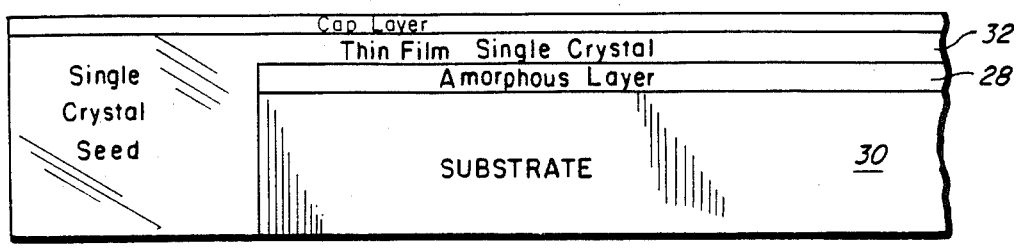
FIG. 3 is a cross section of a semiconductor material structure formed in accordance with the present invention in which the single crystal film extends horizontally from the single crystal seed, having been crystallized into single crystal material.

Referring now to FIG. 3 another embodiment of the present invention is schematically illustrated. In FIG. 3, an intervening amorphous layer 28 is placed between the substrate 30 and the thin film 32 that is crystallized into single crystal. The process of crystallizing the thin film layer 32 into single crystal is as illustrated in and described with reference to FIGS. 2D through 2F.

Figure 4:
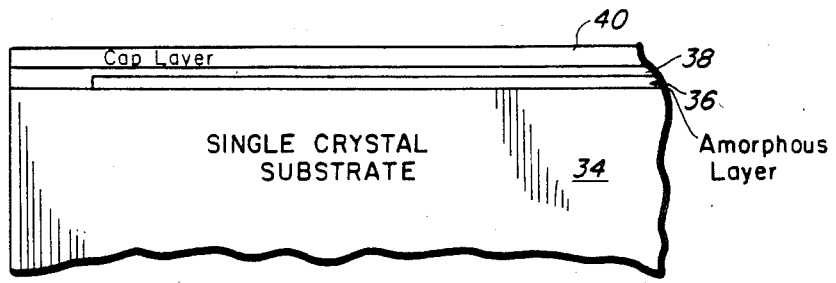
FIG. 4 is an illustration of another application of the present invention wherein the single crystal thin film is seeded by vertical epitaxy and crystallized by horizontal epitaxy over an amorphous layer.

FIG. 4 illustrates how the present invention can be used to form a single crystal thin film on a single crystal substrate. In FIG. 4, the single crystal substrate 34 has an amorphous layer 36 placed over it and then the thin film 38 of semiconductor material is placed over the amorphous layer 36 and the single crystal substrate as is illustrated. In this example, a capping layer 40 is also used. Then, the controlled energy beam as is described with relationship to FIGS. 2D through 2F is applied through the capping layer 40 to the thin film layer 38 to melt it and to crystallize it into a single crystal thin film.

Figure 5:
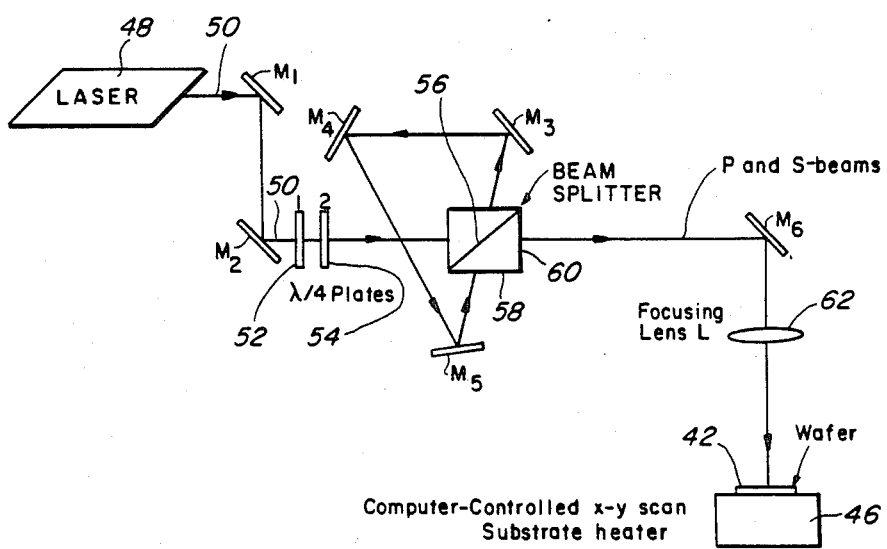
FIG. 5 is a schematic illustration of a scanning, split beam, CW laser heating system in accordance with the present invention.

Referring now to FIG. 5 the schematic drawing of the scanning, split beam, CW laser heating system suitable for use in the present invention will be described. The wafer 42 is placed upon a computer controlled x-y scan substrate heater fixture 46. The fixture 46 is used to control the scan speed and the direction used in the laser by moving the wafer in relationship to the laser beam. A laser generator such as a coherent INNOVA, 20 watt, argon ion, CW laser 48 is used to obtain single and multi line, linearly polarized, circularly shaped laser beam output 50 in the $TEM_{00}$ mode. The laser beam 50 is directed at a first dielectric mirror $M_1$ positioned to reflect onto dielectric mirror $M_2$. The dielectric mirrors $M_1$ and $M_2$ direct the beam 50. Quarter wave plates 52 and 54 are positioned to be in line with the reflected laser beam 50 as it is reflected off of mirror $M_2$. The quarter wave plates 52 and 54 are used to alter beam polarization as is well known. When the incoming beam 50 encounters the internally reflecting surface 56 within beamsplitter cube 58, the beam 50 is split into two parts. A portion of the beam 50 corresponding to the component with its electrical vector parallel to the plane of incidence is transmitted through the rear face 60 of the beamsplitter cube 58. This portion of the beam is called the p-polarization or p-beam. It emerges unaltered from the beamsplitter's rear face 60. The remaining portion of the beam 50, corresponding to the component with its electrical vector perpendicular to the plane of incidence, is internally reflected towards the left side face by the internally reflecting surface 56. This portion of the beam is called the s-polarization or s-beam.

The s-beam emerges at some angle, e.g. 15.2° in the present example, from the normal to the beamsplitter 58's left side face and is refracted at the glass-air interface. If the laser 48 is operated in the multiline mode, each wavelength undergoes a refraction that results in the original beam being dispersed, commonly referred to as color dispersion. This amount of s-beam dispersion is a function of the beam's wavelength. The s-beam is then folded about the beamsplitter 58 via reflecting mirrors $M_3$, $M_4$ and $M_5$ and re-enters the beamsplitter at the right face, and is reflected a second time off the internally reflecting interface 56 and emerges from the rear face 60 in a similar manner as the transmitted p-beam. The p and s-beams are then directed through the focussing lens 62 by means of reflecting mirror $M_6$ to the wafer 42 to be crystallized. Lens 62 serves to reduce the beam's spot size and increase its intensity.

By varying the amount of overlap between the p and s-beams, and by operating the laser 48 in both single and multiline modes, a wedge-shaped heat source meeting the constraints illustrated in FIGS. 1A and 1B can be created. With the use of these beam configurations, semiconductor films can be crystallized on the substrate into single crystal material.

Figure 6:
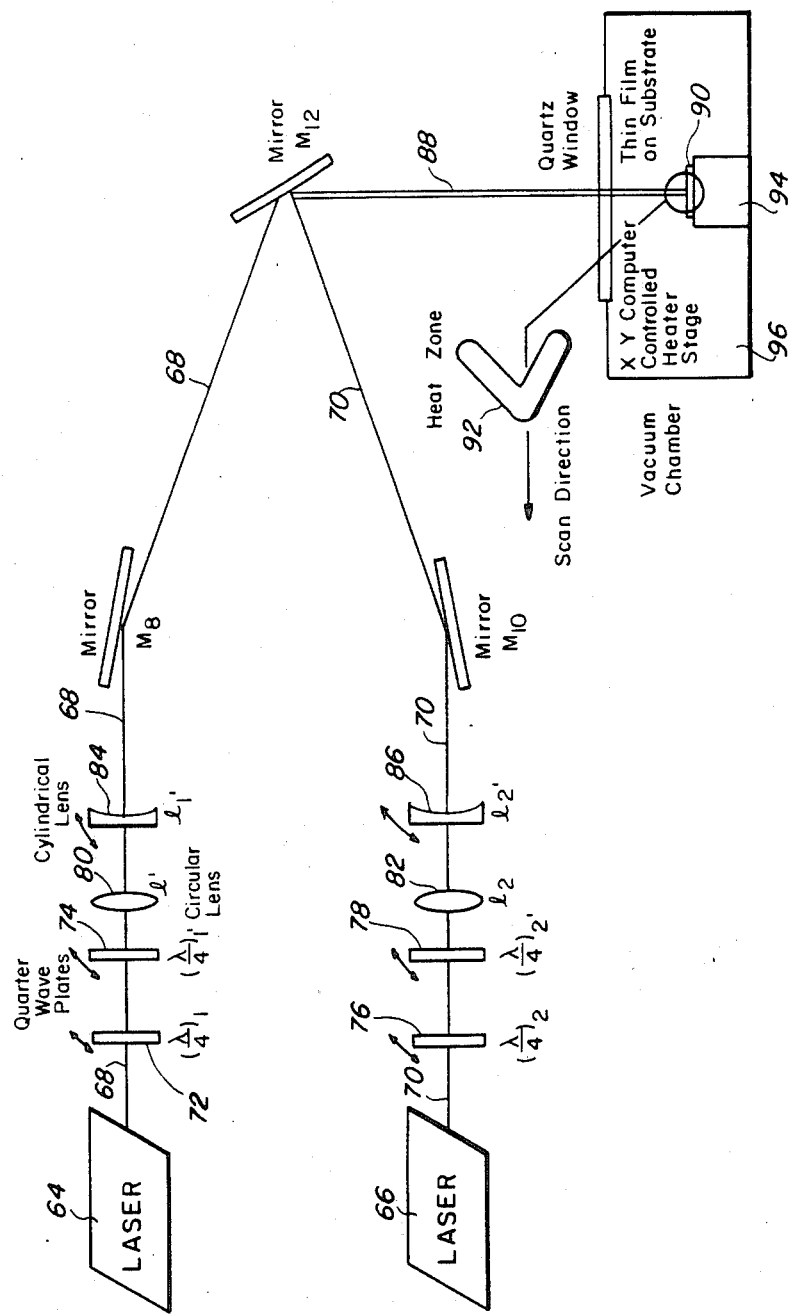
FIG. 6 is a schematic illustration of an alternate embodiment of a scanning, twin beam, CW laser heating system in accordance with the present invention.

The 'Constrained Facet Crystal Growth' model describes the mechanism by which the geometry of the hot zone controls the crystallization of thin films on amorphous substrates. This geometry can be achieved by the use of two elliptically shaped laser beams. Elliptical beams may be obtained by focusing circular laser beams through cylindrical lenses, and can be tilted with respect to one another to form an angular shaped hot zone. The line shape of the elliptical beams can be used to accurately define $\theta$ the lasers formed hot zones' angular trailing liquid edge. In FIG. 6, first and second high power, CW lasers 64 and 66 are positioned as illustrated. The lasers 64 and 66 may be of the same type described with respect to FIG. 5. These two high power CW lasers are used to obtain linearly polarized visible light in the $TEM_{00}$ mode. The beams 68 and 70 are passed respectively through pairs of quarterwave plates 72, 74 and 76, 78 for beam polarization and power adjustment. Circular lenses 80 and 82, respectively are used to focus the beams 68 and 70. Cylindrical lenses 84 and 86 are used to alter the beam shape from circular to elliptical and to rotate each beam so as to allow the beams to project a wedge-shaped hot zone on the film. The beams 68 and 70, respectively emerge as elliptically shaped beams from the cylindrical lenses 84 and 86 where they are directed with dielectric mirrors $M_8$ and $M_{10}$ to dielectric mirror $M_{12}$. Dielectric mirror $M_{12}$ further directs the two beams 68 and 70 into a single wedge shaped beam 88 at the film. Each of the two elliptical beams' size and its axial ratio is determined by the focal length of the lenses 80 and 82 and the conjugate points of lenses 84 and 86 as well as the distance between the lenses and the distance between the lenses and the thin film being crystallized. The tips of the elliptically shaped beams are directed with the mirrors to overlap to form a wedge shape with its apex in the direction of the scan. A symmetrical wedge shaped heat zone has now been formed by the use of the two similar laser-lens arrangements described. The size of the angle included between the elliptical beams is now adjusted by rotating the cylindrical lenses about their axes to thereby control the angle $\theta$. The thin film (not shown) on the substrate of wafer 90 is thus irradiated with a wedge shaped heat zone 92 as illustrated in FIG. 6 and meeting the requirements illustrated with respect to FIG'S 1A and 1B. The scan direction and scan speed are controlled by the xy computer controlled heater stage 94 contained within vacuum chamber 96 as would be readily understood by those of ordinary skill in this art.

Figure 7:
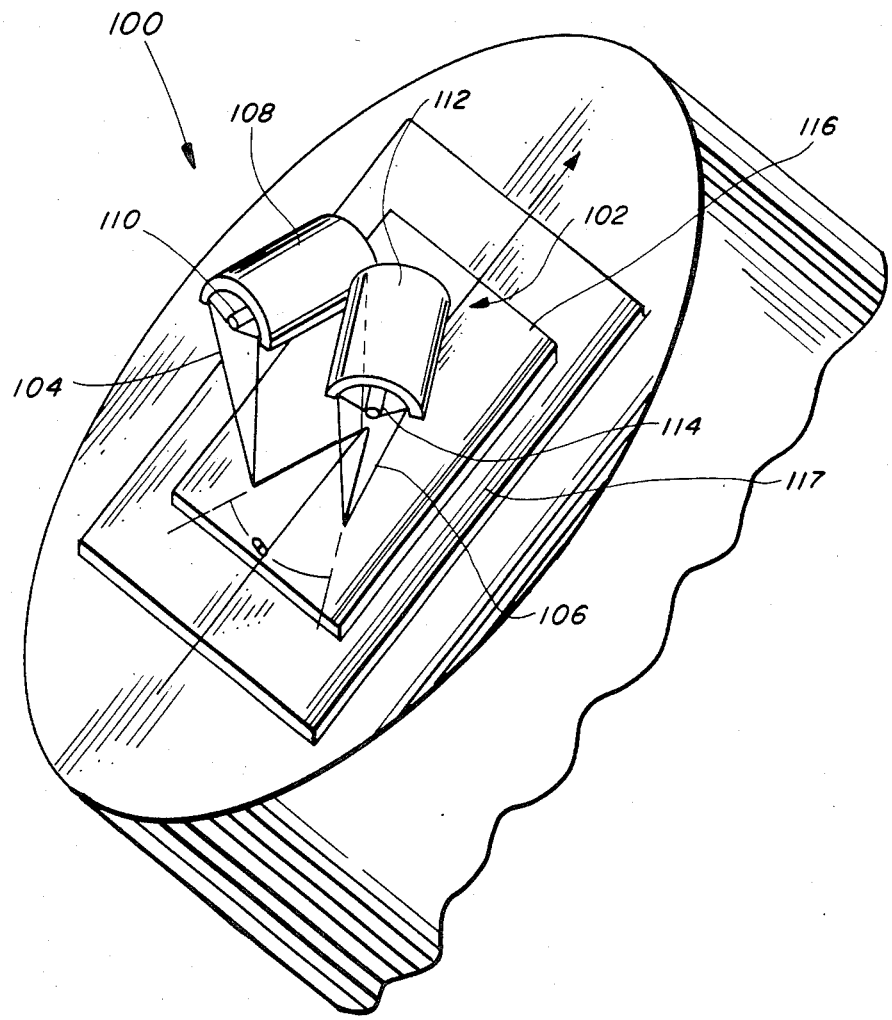
FIG. 7 is a schematic illustration of an alternate embodiment of the present invention that uses two high energy light sources for creating the wedge-shaped hot

Other techniques such as resistance heating and high intensity light, electron beam and resistance heating sources can also be used to obtain the crystallizing hot zones defined by the model illustrated in FIGS. 1A and 1B. Referring to FIG. 7, a first high energy light source 100 and a second high energy light source 102 are positioned so as to generate heating beams 104 and 106, respectively. Light source 100 is comprised of elliptical reflector 108 and, for example mercury arc lamp 110. Light source 102 similarly is comprised of elliptical reflector 112 and mercury arc lamp 114. The light-heat sources 100 and 102 are positioned so as to generate the beams 104 and 106 which create the required wedgeshaped heat zone having the included angle $\theta$ at the trailing edge of the heat zone applied to the wafer or sample 116. It should be understood that other types of lamps may be used such as xenon or tungsten/halogen lamps. To provide for sample heating of the sample 116, if so desired the sample 116 may be placed on substrate heater 117 and positioned within quartz heating chamber 119 as is illustrated.

Figure 8:
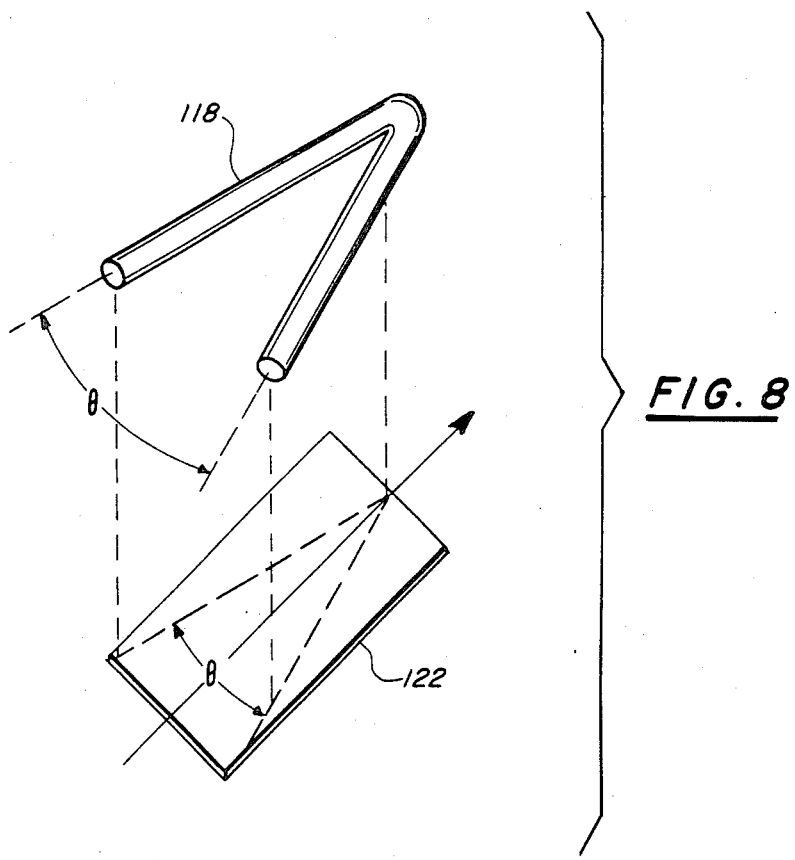
FIG. 8 is a schematic illustration of another alternate embodiment of the present invention that uses a resistance heater for creating a wedge-shaped hot zone.

Referring to FIG. 8, shaped strip-heater 118 is positioned over sample 122 to generate the required wedge-shaped molten zone having the included angle $\theta$ at the trailing edge of the heat zone. The shaped strip-heater 118 may comprise any suitable type of shaped strip heaters such as a shaped graphite heater.

Figure 9:
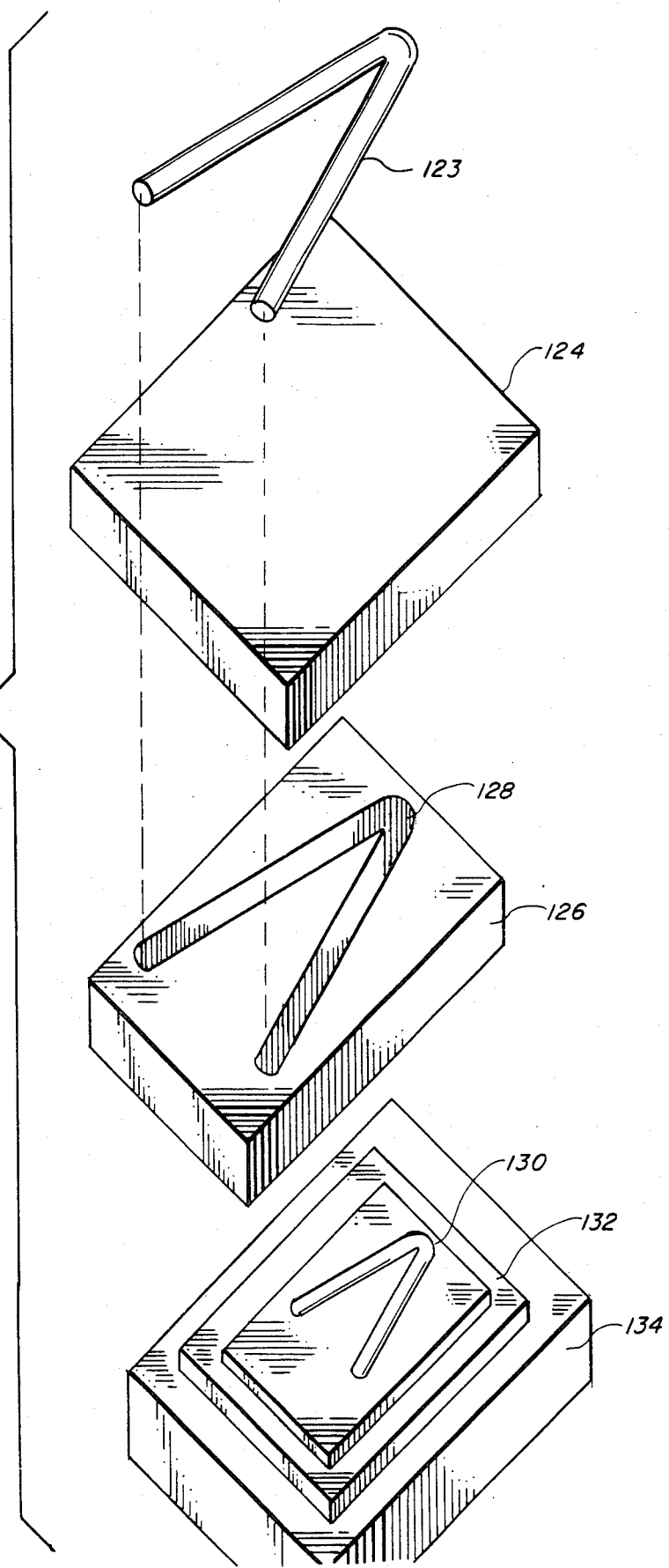
FIG. 9 is a schematic illustration of a still further alternate embodiment of the present invention that a single electron beam source with a template containing a wedge-shaped aperture for creating the wedge-shaped hot zone.

Referring to FIG. 9, wedged-shape electron beam (E-beam) cathode 123 is positioned above electromagnetic focussing element 124. The E-beam is then directed through template 126 which has a wedge-shaped aperture 128 for further refining the E-beam into the desired wedge-shape such that the constraints for the included angle of the hot zone's trailing liquid edge are met as previously described. The wedgeshaped E-beam thus irradiates sample 130 which is positioned on sample holder 132. Scanning can be accomplished with X-Y computer controlled heater stage 134 as previously described.

Figure 10:
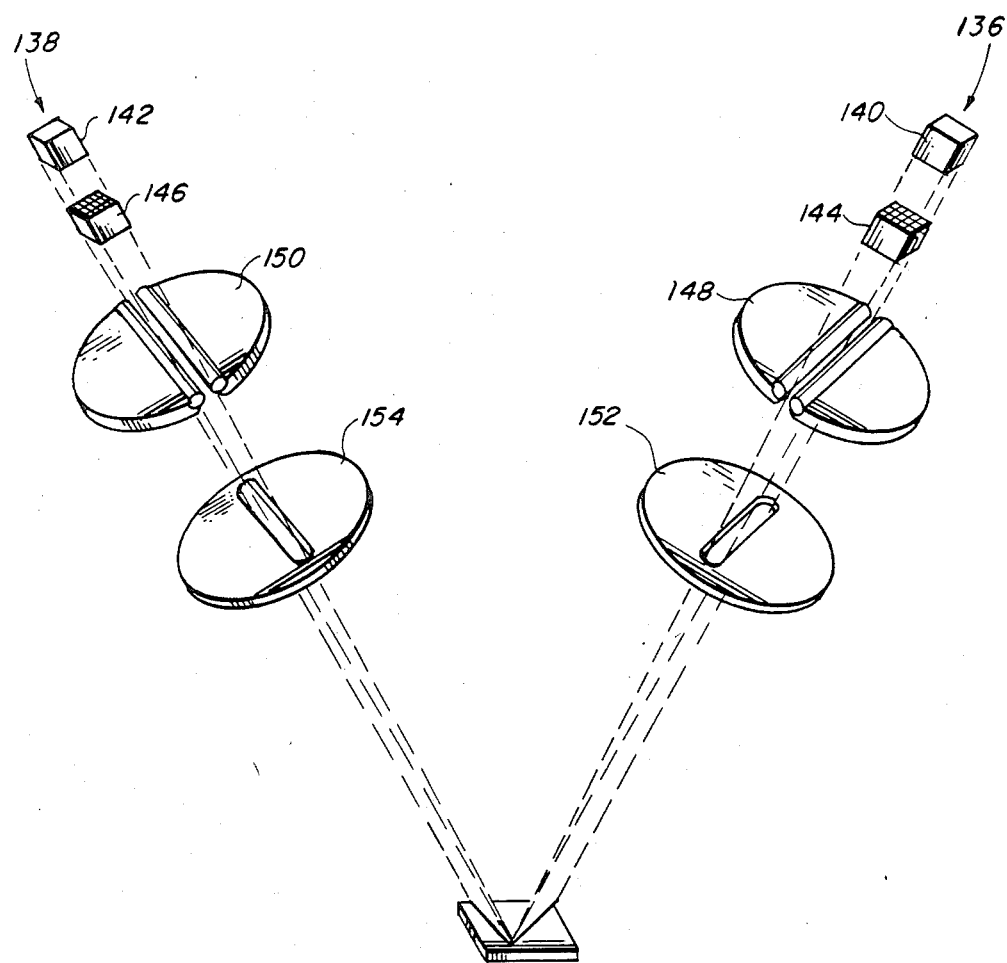
FIG. 10 is a schematic illustration of another embodiment of the present invention that uses dual electron beam sources to generate the required wedge-shaped hot zone.

Referring to FIG. 10, it can be seen that the required wedge-shaped hot zone may also be created by using first and second E-béam generators 136 and 138 each comprising an E-beam cathode 140 and 142, respectively, an extraction grid 144 and 146, respectively, and an acceleration gap 148 and 150, respectively. The E-beam 152 and 154 are combined to create the required wedge-shaped hot zone at the surface of sample 156 which may be scanned by means of an xy computer controlled heater stage (not shown).

Reference is again made to Appendix 1 to this application hereby incorporated by reference in its entirety.

Obviously, many other modifications and variations of the present invention are possible in the light of the above teachings. It is therefore to be understood that within the scope of the appended claims the invention may be practiced otherwise than as specifically described.

I claim:

1. A method of forming single crystal material from a material that has a crystalline state comprising the steps of:
    (a) providing a layer of said material that has a polycrystalline state, said material that has a crystalline state having a preferred growth angle $\alpha$ which is defined by the intersection of the preferred growth planes of said material having a crystalline state;
    (b) providing a shaped heat source that generates a shaped hot zone;
    (c) scanning said heat source across a surface of said material that has a crystalline state so as to melt within said hot zone at least a portion of the surface of said material that has a crystalline state and such that said melted portion at the trailing edge of said hot zone has an included wedge angle $\theta$, being less than $\alpha$, and such that said melted portion solidifies into single crystal material.

2. The method of claim 1 wherein:
said material that has a crystalline state comprises silicon.

3. The method of claim 1 wherein:
said heat source comprises a laser heating source.

4. The method of claim 3 wherein:
said step of providing a laser heating source comprises the steps of:
providing first and second CW lasers having first and second laser beam outputs;
focussing said first and second laser beam outputs to combine said first and second laser beam outputs so as to create said melted portion having said included wedge angle.

5. The method of claim 3 wherein said step of providing a laser heating source comprises the steps of:
providing a cw laser having a laser beam output;
optically splitting said laser beam output into first and second beams, the first beam having a first optical polarization and the second beam having a second optical polarization;
focussing and geometrically adjusting the location of said first and second beams such that they are juxtaposed so as to create said melted portion having said included wedge angle $\theta$.

6. The method of claim 3 wherein said scan is at a rate greater than 0.5 centimeter per second.

7. The method of claim 1 wherein:
said heat source comprises first and second high energy light sources positioned so as to generate said wedge-shaped hot zone.

8. The method of claim 1 wherein:
said heat source comprises a wedge-shaped resistance heater rod positioned so as to generate said melted portion having said included wedge angle $\theta$.

9. The method of claim 1 wherein:
said heat source comprises an electron beam heat source.

10. The method of claim 9 wherein electron beam source comprises:
a wedge-shaped heat source for generating an electron beam;
means for focussing said electron beam positioned to be irradiated by said electron beam; and
a template having a wedge-shaped aperture positioned to be irradiated by said electron beam.

11. The method of claim 8 wherein said electron beam heat source comprises:
first and second electron beam generators for generating first and second electron beams and positioned so as to form a wedge-shaped electron beam.

12. The method of claim 7 wherein said scan is at a rate less than 0.5 centimeter per second.

13. The method of claim 8 wherein said scan is at a rate less than 0.5 centimeter per second.

14. The method of claim 9 wherein said scan is at a rate less than 0.5 centimeter per second.

* * * * *